(12) United States Patent
Hughes

(10) Patent No.: US 7,906,350 B2
(45) Date of Patent: Mar. 15, 2011

(54) METHOD FOR CALIBRATING A METROLOGY TOOL

(75) Inventor: Gregory P. Hughes, Austin, TX (US)

(73) Assignee: Toppan Photomasks, Inc., Round Rock, TX (US)

( * ) Notice: Subject to any disclaimer, the term of this patent is extended or adjusted under 35 U.S.C. 154(b) by 0 days.

(21) Appl. No.: 12/651,652

(22) Filed: Jan. 4, 2010

(65) Prior Publication Data

US 2010/0107724 A1    May 6, 2010

Related U.S. Application Data

(60) Division of application No. 11/332,106, filed on Jan. 13, 2006, now Pat. No. 7,663,156, which is a continuation of application No. PCT/US2004/023070, filed on Jul. 16, 2004.

(60) Provisional application No. 60/488,150, filed on Jul. 17, 2003.

(51) Int. Cl.
*G01R 31/26* (2006.01)
*H01L 21/66* (2006.01)

(52) U.S. Cl. .............................. 438/14; 438/16; 257/100

(58) Field of Classification Search .................... 438/14, 438/16; 257/5, 100; 702/97, 104; 356/328, 356/401

See application file for complete search history.

(56) References Cited

U.S. PATENT DOCUMENTS

| | | | |
|---|---|---|---|
| 5,332,898 A | 7/1994 | Toro-Lira et al. | 250/307 |
| 5,789,118 A | 8/1998 | Liu et al. | 430/5 |
| 5,798,947 A * | 8/1998 | Ye et al. | 702/95 |
| 6,556,884 B1 * | 4/2003 | Miller et al. | 700/121 |
| 6,674,092 B1 * | 1/2004 | Lo et al. | 257/48 |
| 6,750,961 B2 | 6/2004 | Niu et al. | 356/237.5 |
| 7,304,302 B1 | 12/2007 | Nunan et al. | 250/311 |

OTHER PUBLICATIONS

Chinese Office Communication, Chinese Patent Application for Invention No. 200480026551.X (PCT/US2004/023070), 12 pages, Jul. 18, 2008.
Chinese Office Communication, Chinese Patent Application for Invention No. 200480026551.X, 5 pages, Apr. 10, 2009.
Notification of the International Search Report and The Written Opinion for PCT/US04/23070, 7pages, Jul. 16, 2004.
Transmittal of International Preliminary Report on Patentability; PCT/US2004/023070; pp. 5, Mailing Date Feb. 2, 2006.
Japanese Office Action translation; International Patent Application No. PCT/US2004/023070; Japanese Patent Application No. 2006-520,391; pp. 2, (Jul. 16, 2004 & Sep. 7, 2006).

* cited by examiner

*Primary Examiner* — Phuc T Dang
(74) *Attorney, Agent, or Firm* — Baker Botts L.L.P.

(57) ABSTRACT

A method and apparatus for calibrating a metrology tool are disclosed. The apparatus includes a substrate having at least one calibration site formed thereon. The calibration site includes a pattern of cells that have at least one feature disposed in a surface of the substrate. The feature provided for measurement by a step height metrology tool and a phase metrology tool to calibrate the step height and phase metrology tools.

6 Claims, 4 Drawing Sheets

METHOD FOR CALIBRATING A METROLOGY TOOL

CROSS REFERENCE TO RELATED APPLICATIONS

This application is a divisional application of U.S. patent application Ser. No. 11/332,106 filed Jan. 13, 2006, now U.S. Pat. No. 7,663,156; which is a continuation of International Patent Application No. PCT/US04/23070 filed Jul. 16, 2004, which designates the United States and claims priority to U.S. Provisional Application No. 60/488,150 filed Jul. 17, 2003; which are incorporated herein by reference in their entirety.

TECHNICAL FIELD OF THE INVENTION

The present invention relates in general to semiconductor device manufacturing and, more particularly to a method and apparatus for calibrating a metrology tool.

BACKGROUND OF THE INVENTION

As semiconductor device manufacturers continue to produce smaller devices, the requirements for photomasks used in the fabrication of these devices continue to tighten. Photomasks, also known as reticles or masks, typically consist of substrates (e.g., high-purity quartz or glass) that have a non-transmissive layer (e.g., chrome) formed on the substrate. The non-transmissive layer includes a pattern representing a circuit image that may be transferred onto a semiconductor wafer in a lithography system. As feature sizes of semiconductor devices decrease, the corresponding circuit images on the photomask also become smaller and more complex. Consequently, the quality of the mask has become one of the most crucial elements in establishing a robust and reliable semiconductor fabrication process.

The quality of a photomask is typically controlled by a specification that provides the requirements that a photomask must meet in order to be used to fabricate semiconductor devices on a wafer. For example, a specification may include the requirements for pattern position accuracy, feature size control, defect density and phase shift tolerance for a specific manufacturing process.

The pattern position accuracy, feature size control and phase shift tolerance on an individual photomask may be measured by a metrology tool. Typically, a metrology tool should have no more than ten percent error relative to the specification in order to provide quality assurance. A metrology tool, therefore, must be able to precisely and accurately measure a feature on a photomask in order to meet the requirements in the specification.

Standards used to calibrate different metrology tools have been created in order to ensure the precision and accuracy of the measurements obtained by the metrology tools. Currently separate standards exist for metrology tools, such as a profilometer and an atomic force microscope (AFM), that measure the vertical profile of a feature on a substrate or wafer. For example, a chrome pattern on an etched quartz substrate may be used for the profilometer and a platinum coated $SiO_2$ pattern on a silicon substrate may be used for the AFM. These standards may be used to calibrate the tools to a specification for a specific manufacturing process. Unlike profilometers and AFMs, no standard currently exists for metrology tools that measure a phase shift created by a photomask. Currently, a manufacturer may use control vehicles having arbitrary phase shifts to calibrate their phase metrology tools without knowing if the original phase of the control vehicle was correct. This approach has two problems. First, the accuracy of the calibration is about two degrees because the lithography is not very sensitive to phase error. Second, the results may be effected by spherical lens error in the lithography tool.

SUMMARY OF THE INVENTION

In accordance with teachings of the present invention, disadvantages and problems associated with calibrating a metrology tool have been substantially reduced or eliminated. In a particular embodiment, a feature included on a standard may be measured by a step height metrology tool and a phase metrology tool to calibrate the step height and phase metrology tools.

In accordance with one embodiment of the present invention, a calibration standard includes a substrate having at least one calibration site formed thereon. The calibration site includes a pattern of cells that have at least one feature disposed in a surface of the substrate. The feature is provided for measurement by a step height metrology tool and a phase metrology tool to calibrate the step height and phase metrology tools.

In accordance with another embodiment of the present invention, a calibration standard includes a substrate having at least one calibration site formed thereon. The calibration site includes a pattern of cells having at least one feature disposed in a surface of the substrate. The feature is provided for measurement by a phase metrology tool to obtain a measured phase shift used to calibrate the phase metrology tool.

In accordance with a further embodiment of the present invention, a method for calibrating a metrology tool includes providing a substrate including at least one calibration site having a pattern of cells and providing at least one feature disposed in a surface of the substrate in each of the cells. The feature is measured using a phase metrology tool to provide a measured phase shift. The measured phase shift is compared with an initial phase shift and the phase metrology tool is adjusted if the measured phase shift does not equal the initial phase shift.

Important technical advantages of certain embodiments of the present invention include a standard that may be used to calibrate multiple types of metrology tools. The standard includes a pattern of features provided for measurement on a step height metrology tool that measures the profile of the features and a phase metrology tool that measures the phase shift associated with the features. The addition of a phase shift standard allows manufacturers to establish control of phase specifications on phase shift photomasks manufactured in different manufacturing facilities.

Another important technical advantage of certain embodiments of the present invention includes a standard that improves the precision and accuracy of the data collected by a phase metrology tool. Traditionally, phase metrology tools are calibrated by using control vehicles having arbitrary phase shifts. Manufacturers, however, may not know if the phase shift of the control vehicle was determined correctly. The standard of the present invention may include features that may be directly measured such that the phase metrology tool may be directly calibrated to a known phase shift.

A further important technical advantage of certain embodiments of the present invention includes a standard that reduces calibration variations between different metrology tools. The standard contains features that may be measured by any step height and phase metrology tools in a single manufacturing facility or throughout multiple manufacturing facilities. Because the same standard may be used to calibrate each tool, the number of standards that need to be manufactured may be reduced and measurement variations due to the use of different calibration standards may be eliminated.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 7, where like numbers are used to indicate like and corresponding parts.

Figure 1:
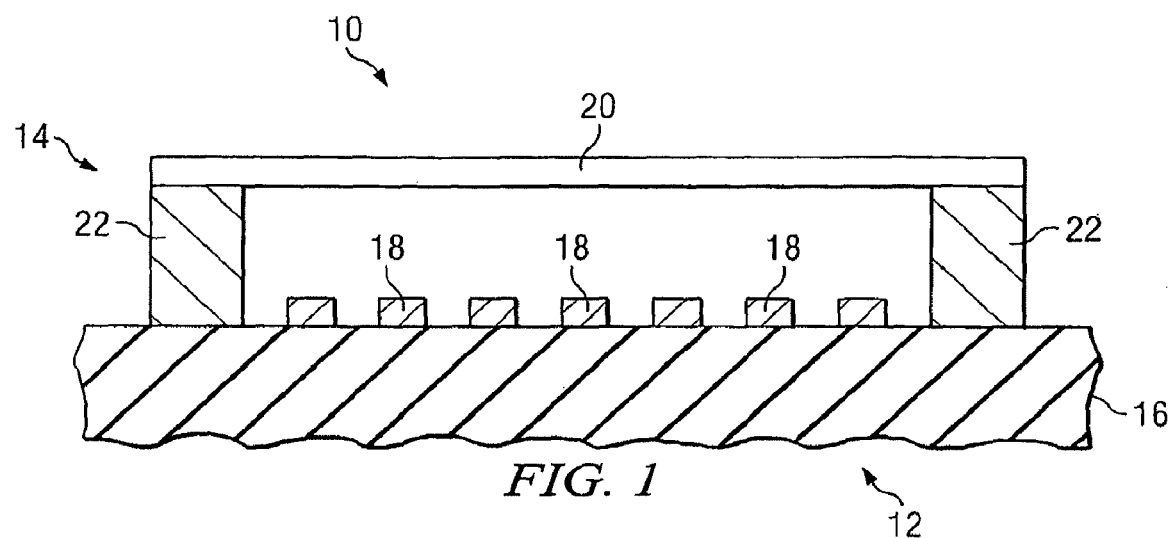
FIG. 1 illustrates a cross-sectional view of a photomask assembly manufactured according to teachings of the present invention.

FIG. 1 illustrates a cross-sectional view of photomask assembly 10 qualified by a metrology tool. Photomask assembly 10 includes pellicle assembly 14 mounted on photomask 12. Substrate 16 and patterned layer 18 form photomask 12, also known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM) (e.g., an alternating aperture phase shift mask, also known as a Levenson type mask), an optical proximity correction (OPC) mask or any other type of mask suitable for use in a lithography system.

Photomask 12 includes patterned layer 18 formed on a surface of substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (e.g., MOCN, where M is selected from the group consisting of chromium, cobalt, iron, zinc, molybdenum, niobium, tantalum, titanium, tungsten, aluminum, magnesium, and silicon), or any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. In one embodiment, the mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer. In some embodiments, the mask pattern file may include more than one layer of the integrated circuit such that a photomask may be used to image features from more than one layer onto the surface of a semiconductor wafer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

During a manufacturing process for photomask 12, different parameters associated with features formed in patterned layer 18 and/or substrate 12 may be measured to determine if the parameters meet a semiconductor manufacturing specification. The parameters associated with photomask 12 may include pattern position accuracy, also referred to as registration or overlay, feature size control, also referred to as feature critical dimension, and phase shift and surface characteristics. Typically, a metrology tool, such as a profilometer, atomic force microscope (AFM) or a phase metrology tool, may be used to measure different sites on a photomask and determine if features located at a particular site meet the requirements of the semiconductor manufacturing specification.

In order to ensure that the measurements obtained by the metrology tool are accurate and precise, a standard may be used to calibrate the metrology tool. Today, separate standards exist for profilometers and AFMs and no standard exists for phase metrology tools. The present invention provides a standard that may be used to calibrate a phase metrology tool (e.g., a phase shift measurement system manufactured and sold by Lasertec), a profilometer (e.g., a P11 profilometer manufactured and sold by KLA Tencor) and an AFM (e.g., a Dimension 9000 AFM manufactured and sold by Digital Instruments).

The present invention further provides a standard for use in metrology tools located in different manufacturing facilities. Photomask manufacturers may have multiple manufacturing facilities that each have a different metrology tool to measure photomasks manufactured at that facility. In order to ensure that each photomask is manufactured to the same specification, a standard for use in the metrology tools in each manufacturing facility may be created. The standard may include a substrate having at least one calibration site formed in and/or on the substrate. The calibration site may include a pattern of cells, with each cell having at least one feature etched into the substrate. The dimensions, spacing between and positions of the features may be based on a theoretical specification for a specific manufacturing process. The substrate may be made of a material used as a substrate for photomask 12 or a material used for a semiconductor wafer. Each manufacturing facility may have a separate standard or a single standard may be used by all facilities. The standard may be placed in the metrology tools daily, weekly or with any other suitable frequency during a specific time period.

Each time the standard is placed in a metrology tool, the known parameters (e.g., depth of the features and phase shift related to the depth) may be measured to determine if the same values are obtained each time that the standard is measured. If the measured values are different than initial values, the metrology tool may be adjusted to compensate for malfunctions and/or drifts in measuring caused by the optical imaging equipment in the metrology tool.

Conventional standards may be unique to a specific type of metrology tool. In these instances, a different standard may be used in metrology tools that measure the same parameter of a features on a photomask (e.g., when measuring step height, one standard may be used to calibrate a profilometer and another standard may be used to calibrate an AFM tool). The present invention provides a single standard, which reduces the number of standards used by a manufacturing facility because the standard may be used to calibrate multiple different types of metrology tools.

The single standard may be used to calibrate step height and phase metrology tools because phase shift is related to depth of the feature (d), exposure wavelength of the lithographic or metrology tool ($\lambda$) and index of refraction of the material that the light travels through (n). This relationship may be shown by the following formula:

$$\Phi_o/(360) = d/[\lambda/(n-1)] \quad (1)$$

A phase metrology tool may measure the average phase shift associated with a feature as computed from all of the illuminating radiation as represented by the illumination numerical aperture (NA) of the tool. The average phase is related to the normal incident phase by the following equation:

$$\Phi_{measured} = \Phi_o m \quad (2)$$

$$m = (1+(\frac{1}{4}n))*(NA)^2 \quad (3)$$

where $\Phi_o$ is phase determined from normal incident light, as shown by the equation above, and NA is the illumination NA of the metrology tool. Based on the above two equations, a single standard may be used to calibrate different types of metrology tools, such as profilometers and AFMs, that measure step height associated with a photomask and phase metrology tools that measure phase shift associated with the photomask.

Figure 2:
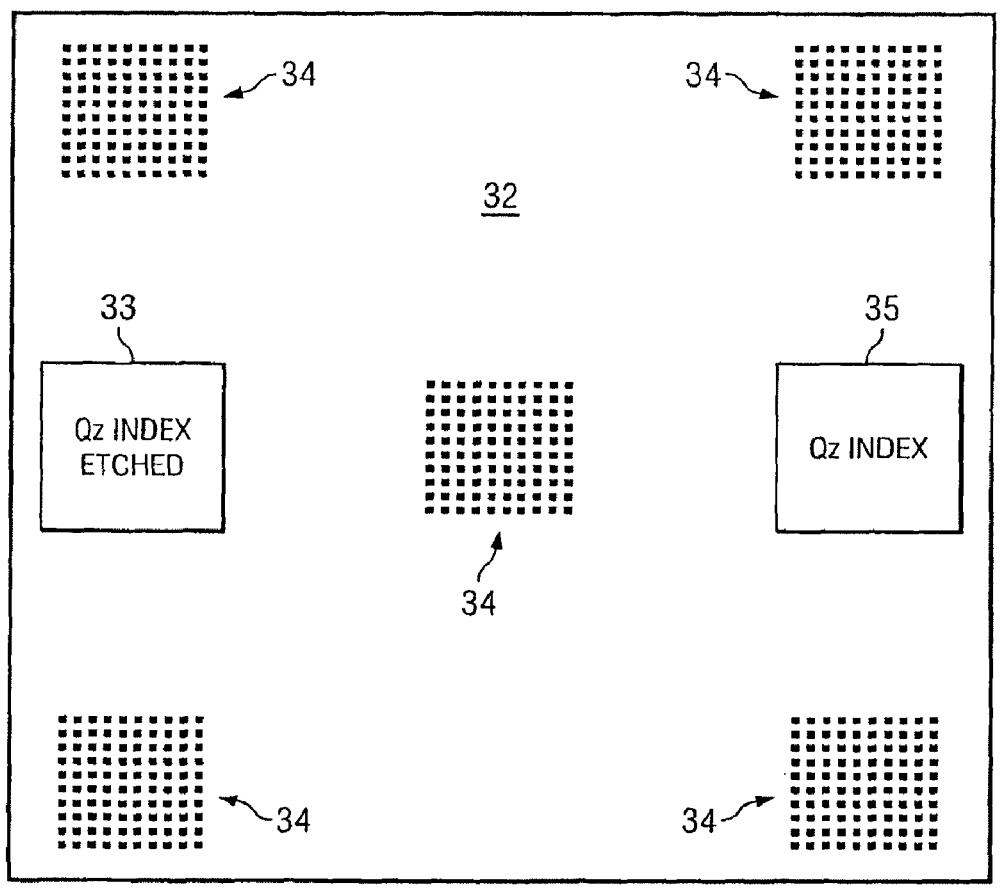
FIG. 2 illustrates a top view of a standard used to calibrate a metrology tool in accordance with teachings of the present invention.

FIG. 2 illustrates a top view of standard 30 used to calibrate a metrology tool. Standard 30 may provide a National Institute of Standards and Technology (NIST) traceable depth reading when measured by a profilometer or AFM, and a NIST traceable phase shift when measured by a phase metrology tool. Standard 30 may be formed from substrate 32, which may be quartz, synthetic quartz, fused silica, magnesium fluoride ($MgF_2$), calcium fluoride ($CaF_2$), silicon or any other suitable material used to fabricate a photomask (e.g., photomask 12 as illustrated in FIG. 1). Standard 30 may include calibration sites 34 and refraction sites 33 and 35 that include a pattern of features used to calibrate a metrology tool. As illustrated, calibration sites 34 may be located at the four corners and center of substrate 32. In other embodiments, at least one calibration site may be located within a mask field of standard 30 at any suitable position. Calibration sites 34 located at suitable positions on substrate 32 provide the opportunity to verify that the measurements provided by the metrology tools were not altered by photomask position effects.

Refraction sites 33 and 35 may be clear areas of substrate 32 that allow the index of refraction of substrate 32 to be confirmed. Refraction sites 33 and 35 may be formed by removing any absorber material formed on substrate 32 to expose the surface. Additionally, each of refractions sites 33 and 35 may have any suitable dimensions that allow the index of refraction to be measured. In one embodiment, refraction site 33 may be a trench in the surface of substrate 32 with a depth of approximately 600 Angstroms. In another embodiment, the depth of the trench may be any appropriate depth that allows a measurement tool to determine if the index of refraction was modified by the etch process. In one embodiment, refraction site 35 may expose the surface of substrate 32.

The index of refraction of substrate 32 may be measured by, for example, a glancing angle Ellipsometer. An initial index of refraction may be known when standard 30 is manufactured. If the measured index of refraction is different than the initial index of refraction, the initial phase may be recalculated (as described above in reference to equations 1 through 3) by using the measured index of refraction. Any measured phase shifts obtained by the phase metrology tool, therefore, may be compared to the recalculated initial phase.

Figure 3:
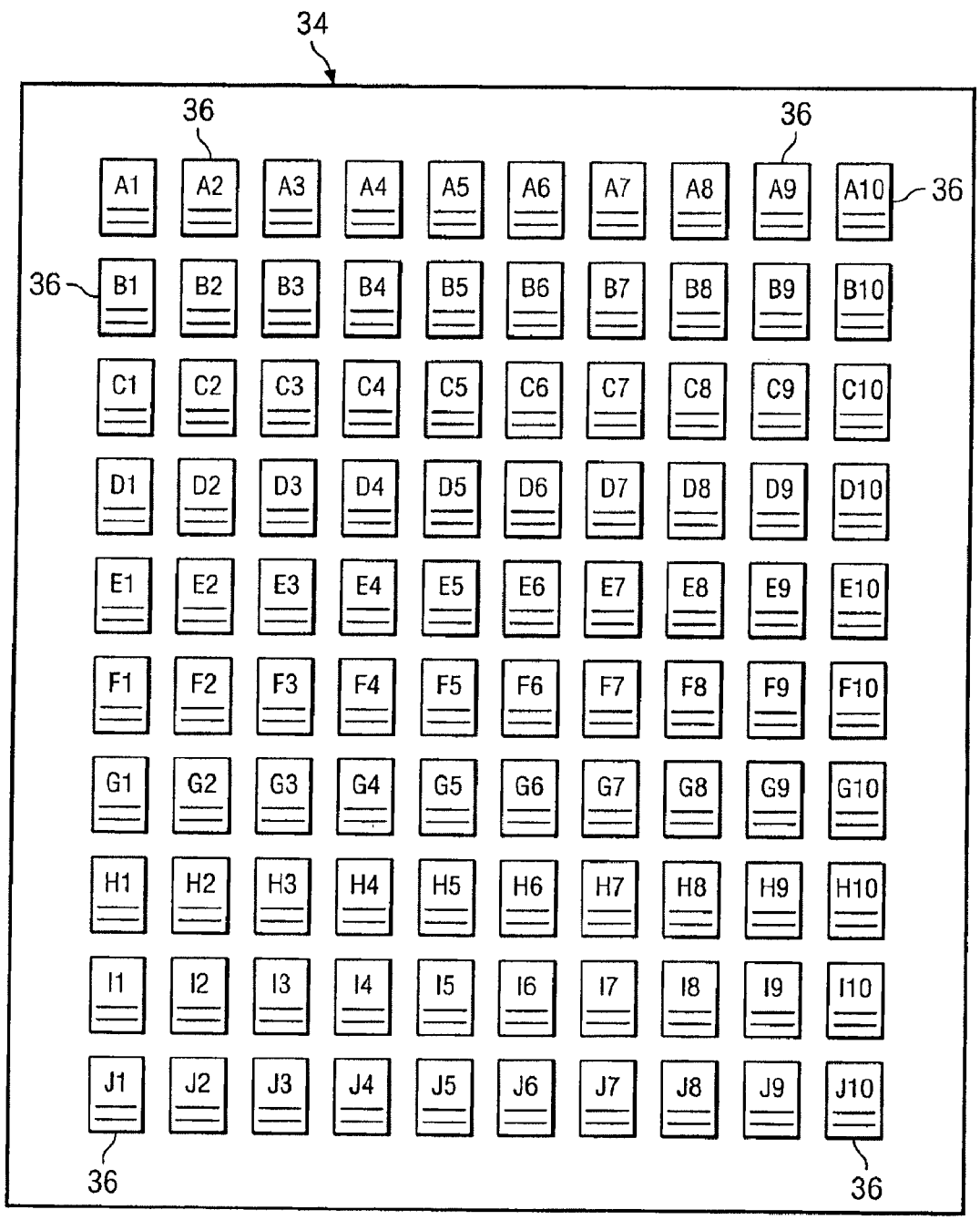
FIG. 3 illustrates a pattern of cells formed as a portion of a calibration site on a standard used to calibrate a metrology tool in accordance with teachings of the present invention.

FIG. 3 illustrates a pattern of cells forming calibration sites 34 on standard 30 used to calibrate a metrology tool. Calibration sites 34 may include multiple cells 36 formed in a pattern such as an array. For example, the pattern may be a ten by ten (10×10) array where each of cells 36 is separated from a neighboring cell by approximately two millimeters (2 mm) such that the entire array covers an area of approximately two square centimeters (2 cm$^2$) on substrate 32. The space between each of cells 36 may be a clear area of substrate 32 or an area of substrate 32 that includes a layer of material, such as the material used to form a patterned layer of a photomask (e.g., patterned layer 18 as illustrated in FIG. 1).

In another embodiment, the array may be rectangular in shape such that it includes more cells across the width of the array than the length of the array or the opposite such that more cells are arranged over the length of the array than the width of the array. Additionally, the array may be greater than or less than a ten by ten (10×10) array. In other embodiments, the cells may be arranged in other patterns, including but not limited to, a checkerboard, a reverse checkerboard or a cross. Multiple cells 36 may be used in each of calibration sites 34 to allow for multiple site metrology and to ensure that a back-up site will be available if one of cells 36 is damaged during the measuring process in the metrology tools.

Figure 4:
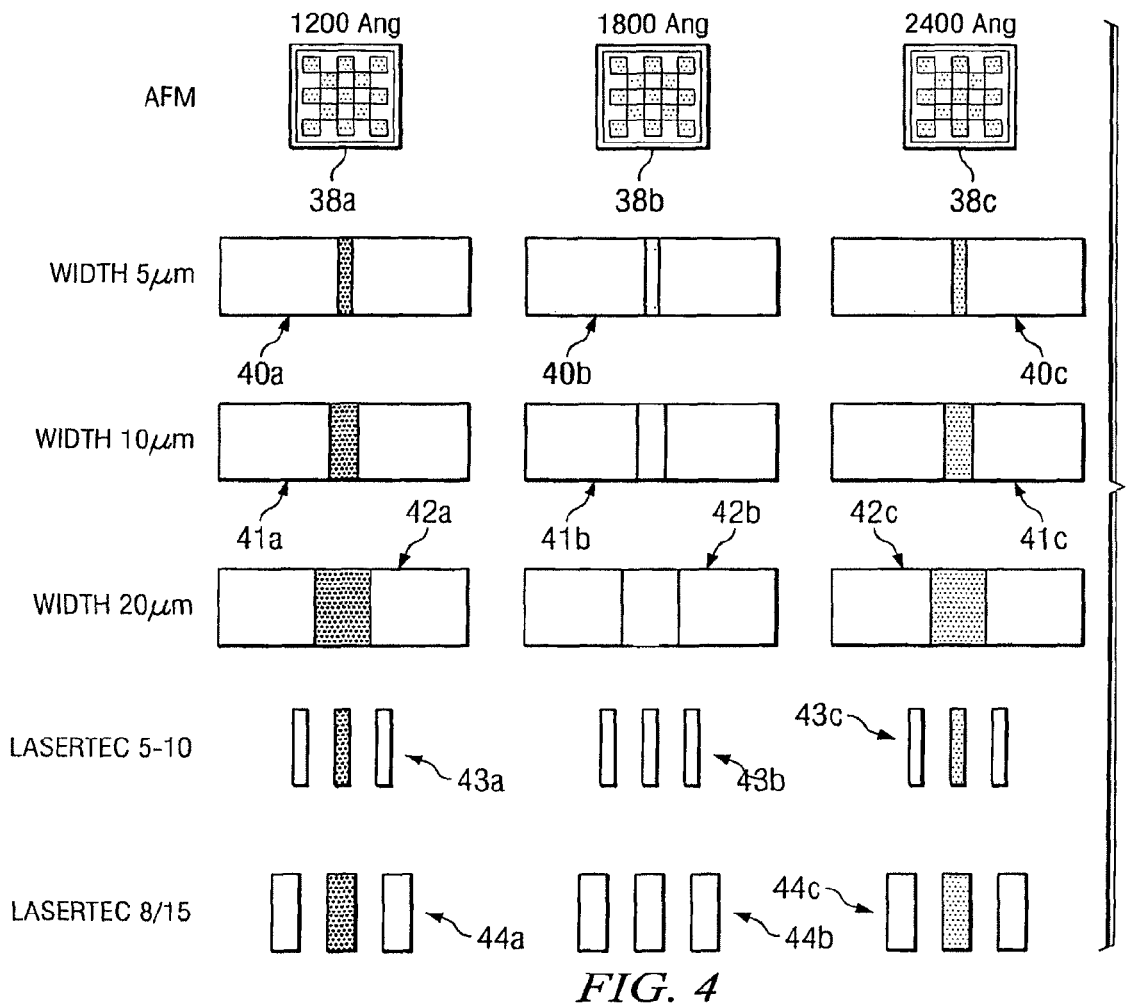
FIG. 4 illustrates a top view of features formed in a cell on a standard used to calibrate a metrology tool in accordance with teachings of the present invention.

FIG. 4 illustrates a top view of features formed in each of cells 36 on standard 30 that is used to calibrate a metrology tool. Each of cells 36 may include AFM features 38, profile features 40, 41 and 42 and phase features 43 and 44. AFM features 38 may be checkerboard and/or reverse checkerboard patterns that may be used to calibrate an AFM tool. When standard 30 is placed in an AFM tool, the pattern may be scanned both vertically and horizontally to determine the step height of AFM features 38. The measured step height may be compared to an initial NIST traceable step height associated with AFM features 38. If the measured step height is not approximately equal to the initial step height, the AFM tool may be adjusted to correct for the difference in measured and initial values.

In the illustrated embodiment, profile features 40, 41 and 42 and phase features 43 and 44 may have different widths and different depths. For example, profile features 40 and phase features 43 may each have a width of approximately five microns (5 μm), profile features 41 and phase features 43 may each have a width of approximately ten microns (10 μm), and profile features 42 may each have a width of approximately twenty microns (20 μm). The range of widths may prevent pattern loading effects from occurring during the measuring process. In other embodiments, profile features 40, 41 and 42 and phase features 43 and 44 may have similar or different widths that are larger than the shearing area and/or spot size of the metrology tool such that spot placement problems are not created.

In the illustrated embodiment, AFM feature 38a, profile features 40a, 41a and 42a, and phase features 43a and 44a may have a depth of approximately 2400 angstroms, which corresponds to a phase shift of approximately 180 degrees at an exposure wavelength of approximately 248 nanometers. Additionally, AFM feature 38b, profile features 40b, 41b and 42b, and phase features 43b and 44b may have a depth of approximately 1800 angstroms, which corresponds to a phase shift of approximately 180 degrees at an exposure wavelength of approximately 193 nanometers. Finally, AFM feature 38c, profile features 40c, 41c and 42c, and phase features 43c and 44c may have a depth of approximately 1200 angstroms, which corresponds to a phase shift of approximately 180 degrees at an exposure wavelength of approximately 157 nanometers. The different depths may be used to evaluate the linearity of the metrology measurements at different exposure wavelengths, for example, in a range between approximately 100 nm and 400 nm.

In another embodiment, additional AFM, depth and phase features may be included in cells 36. The additional AFM, depth and phase features may have different depths that correspond to a phase shift of approximately 180 degrees at other exposure wavelengths, such as 345 nanometers or 126 nanometers. In a further embodiment, AFM features 38, profile features 40, 41 and 42, and phase features 43 and 44 may have similar depths. In other embodiments, the number of AFM, depth and phase features may be any appropriate number that allows profile and phase measurements to be obtained by numerous different types of metrology tools.

Phase features 43 and 44 may include an etched area surrounded by two surface areas on substrate 32. The etched area may have a specific depth as described above and the surface areas may expose the surface of substrate 32. A layer of absorber material, such as the material used to form patterned layer 18 as illustrated in FIG. 1, may be use to separate the etched area from the surface areas.

AFM feature 38, profile features 40, 41 and 42 and phase features 43 and 44 may be etched into substrate 32 using a hot KOH wet etch process that removes surface roughness, eliminates etch dependant depth variation and reduces depth variation across the photomask. In other embodiments, another wet etch process and/or any suitable dry etch process may be used. Although profile features 40, 41 and 42 and phase features 43 and 44 are illustrated as having an etched area surrounded by one or more clear areas of substrate 32, profile features 40, 41 and 42 and phase features 43 and 44 may be formed by surrounding a clear area with one or more etched areas.

Profile features 40, 41 and 42 may be used to calibrate both a profilometer and a phase metrology tool. When standard 30 is placed in a profilometer, profile features 40, 41 and/or 42 may be scanned to determine the step height. As described above in reference to an AFM, the measured step height for profile features 40, 41 and/or 42 may be compared with an initial NIST traceable step height. If the measured step height is not approximately equal to the initial step height, the profilometer may be adjusted to compensate for the error in the measured step height. Additionally, the measured step height may be used to calculate an initial phase shift associated with each of profile features 40, 41 and 42 using the equations 1 through 3 as described above.

Standard 30 may additionally be used to calibrate a phase metrology tool. When standard is exposed to electromagnetic radiation in the phase metrology tool, the wave of light that emerges from the etched area of profile features 40, 41 and 42 and phase features 43 and 44 may have a longer wavelength than the wave of light that remains inside substrate 32. Due to the difference in wavelengths between the wave emerging from the different areas of substrate 32, a phase shift may occur. The phase metrology tool measures the phase shift associated with profile features 40, 41 and 42 and/or phase features 43 and 44, and compares the measured phase shift with an initial phase shift associated with standard 30. If the measured phase shift is not approximately equal to the initial phase shift, the phase metrology tool may be adjusted to compensate for the error in the measured phase shift. As an additional determination of the calibration of both the profilometer and the phase metrology tool, the measured phase shift may additionally be compared to the phase shift calculated with a step height obtained by a profilometer.

In one embodiment, the field of view for a phase metrology tool may be adjusted such that the phase metrology tool only measures phase features 43 and 44. Phase features 43 and 44 may provide a decreased amount of illumination compared to the amount of illumination created by profile features 40, 41 and 42 when each of the features are measured by a phase metrology tool. As such, phase features 43 and 44 may provide a pattern that concentrates the illumination from the phase metrology tool onto the features, which provides an accurate measurement of the phase shift associated with phase features 43 and 44.

Figure 5:
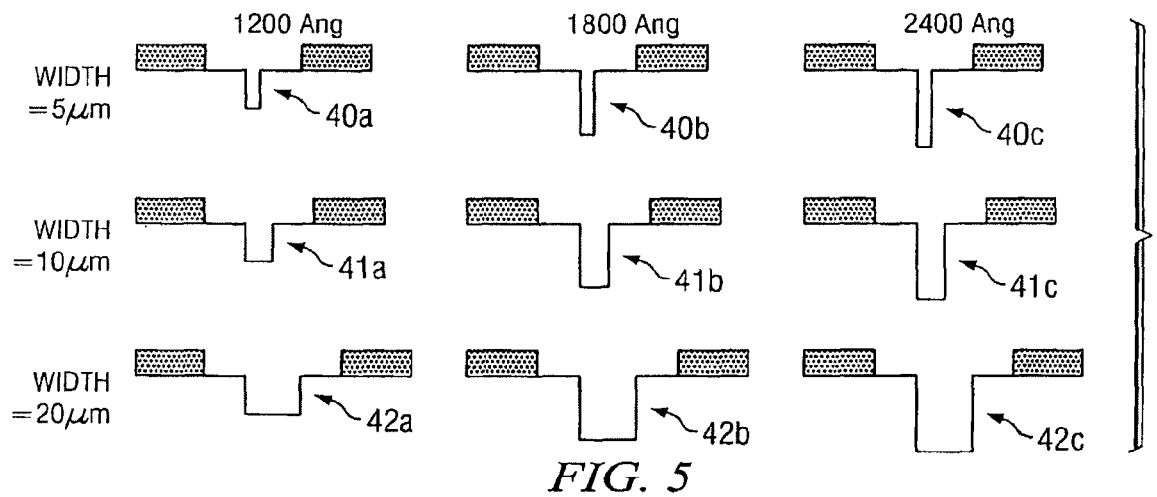
FIG. 5 illustrates a cross sectional view of profile features formed in a cell on a standard used to calibrate a metrology tool in accordance with teachings of the present invention.

FIG. 5 illustrates a cross sectional view of profile features 40, 41 and 42 formed in each of cells 36 on standard 30 used to calibrate a metrology tool. In the illustrated embodiment, profile features 40, 41 and 42 may be formed in substrate 32 such that no material is located near the edges of profile features 40, 41 and 42 formed in substrate 32. In another embodiment, a layer of material may be located a predetermined distance from the edges such that the material separates each of profile features 40, 41 and 42. The material layer may be any type of material that is used to fabricate a photomask.

Figure 6:
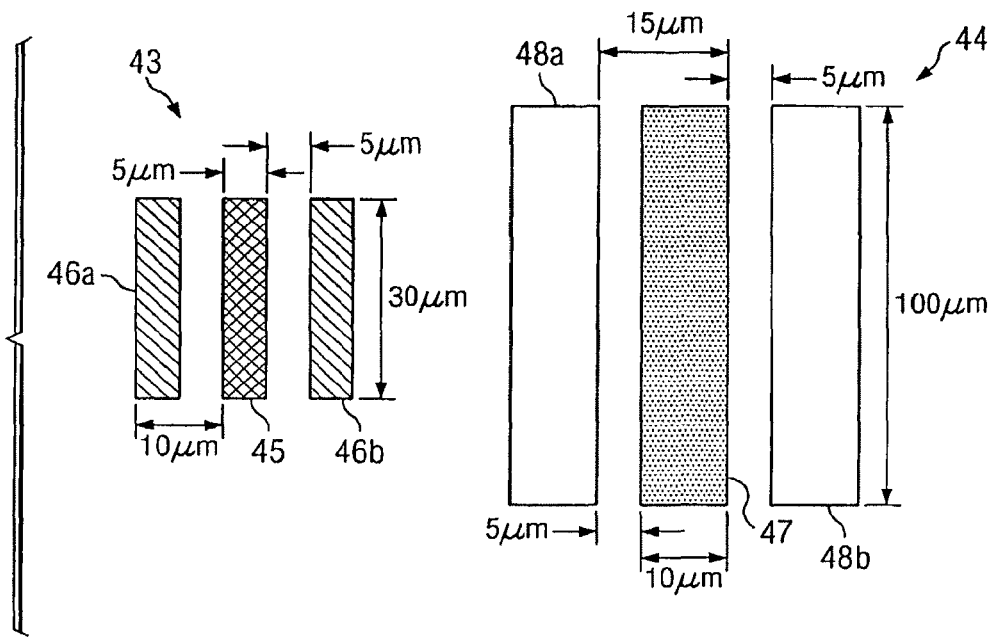
FIG. 6 illustrates a top view of phase features formed in a cell on a standard used to calibrate a phase metrology tool in accordance with teachings of the present invention.

FIG. 6 illustrates a top view of phase features 43 and 44 formed in each of cells 36 on standard 30 used to calibrate a metrology tool. Phase feature 43 may include etched area 45 and surface areas 46a and 46b and phase feature 44 may include etched area 47 and surface areas 48a and 48b. In one embodiment, the spaces between etched area 45 and surface areas 46a and 46b and the spaces between etched area 47 and surfaces areas 48a and 48b may be substantially covered by an absorber material, e.g., the absorber materials used to form patterned layer 18 as illustrated in FIG. 1. In another embodiment, the spaces between etched area 45 and surface areas 46a and 46b and the spaces between etched area 47 and surface areas 48a and 48b may be partially covered by the absorber material, such that a portion of the surface of substrate 32 is exposed near the edges of etched areas 45 and 47. In further embodiments, phase features 43 and 44 may be formed by placing a surface area between two etched areas.

Phase feature 43 may be optimized for use on a phase metrology tool having a five to ten micrometer (5 to 10 μm) shearing distance. In the illustrated embodiment, each of etched area 45 and surfaces areas 46a and 46b may be approximately five micrometers wide (5 μm) and approximately thirty micrometers long (30 μm). In other embodiments, each of etched area 45 and surface areas 46a and 46b may be any appropriately sized shapes. Additionally, etched area 45 may be separated from surface areas 46a and 46b by approximately five micrometers (5 μm). In another embodiment, the areas may be separated by any suitable distance to allow the phase metrology tool to obtain the proper measurements.

Phase feature 44 may be optimized for use on a phase metrology tool have a shearing distance of approximately ten to fifteen micrometers (10 to 15 μm). In the illustrated embodiment, each of etched area 47 and surface areas 48a and 48b may be approximately ten micrometers (10 μm) wide and approximately one-hundred micrometers (100 μm) long. In other embodiments, each of etched area 47 and surface areas 48a and 48b may be any appropriately sized shapes. Additionally, etched area 47 may be separated from surface areas 48a and 48b by approximately five micrometers (5 μm). In another embodiment, the areas may be separated by any suitable distance to allow the phase metrology tool to obtain the proper measurements.

Figure 7:
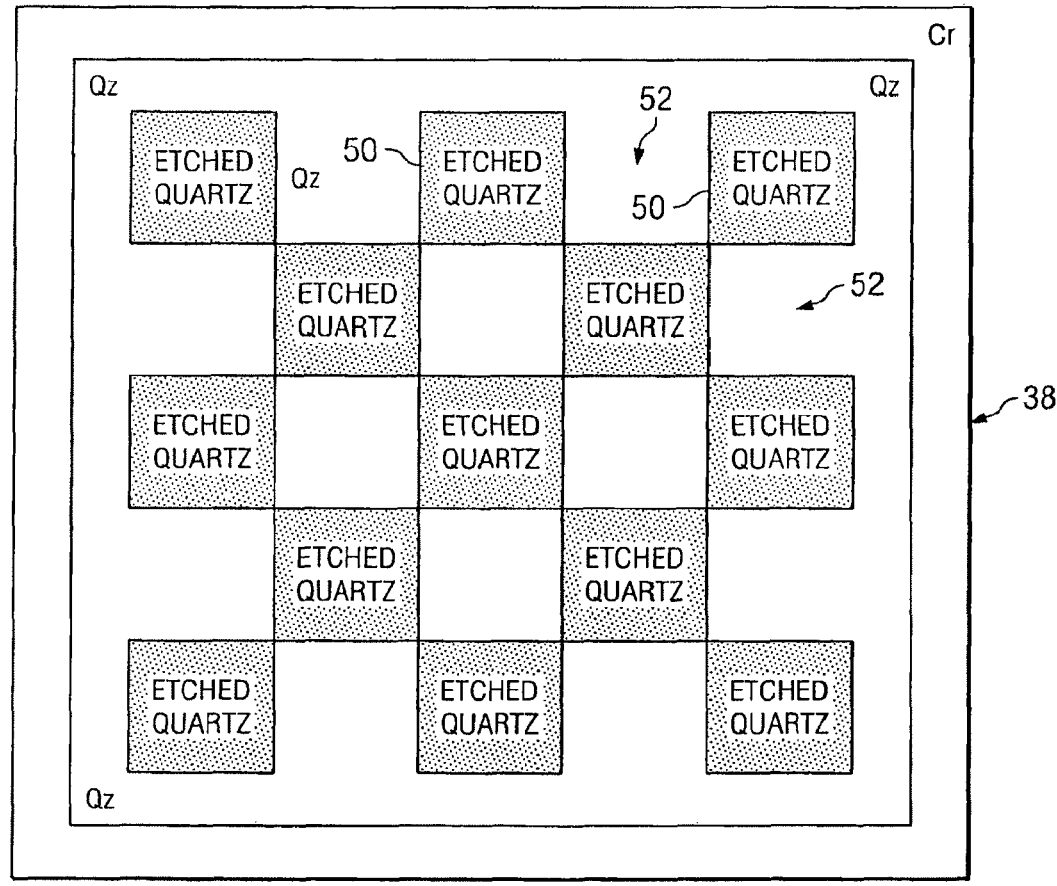
FIG. 7 illustrates a top view of a checkerboard feature formed in a cell on a standard used to calibrate a metrology tool in accordance with teachings of the present invention.

FIG. 7 illustrates AFM feature 38 that may be used as a surface topography standard to calibrate an AFM. AFM feature 38 may include etched features 50 and surface features 52. Etched features 50 may have a predetermined depth, such a depth that produces a phase shift of 180 degrees at an exposure wavelength. Surface features 52 may be formed from substrate 32. In one embodiment, the pitch of the checkerboard pattern may be approximately four microns. AFM feature 38 may be scanned horizontally and vertically in an AFM to create a histogram of the scanned pattern heights that may be used to determine the step height of AFM features 38.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method for calibrating a metrology tool, comprising:
   providing a substrate including at least one calibration site, the calibration site including a pattern of cells;
   providing at least one feature in each of the cells, the at least one feature disposed in a surface of the substrate;
   measuring the feature using a phase metrology tool to provide a measured phase shift;
   comparing the measured phase shift with an initial phase shift associated with the feature; and
   adjusting the phase metrology tool if the measured phase shift does not match the initial phase shift.

2. The method of claim 1, further comprising:
   measuring the feature using a step height metrology tool to provide a measured depth;
   comparing the measured depth with an initial depth associated with the feature; and
   adjusting the step height metrology tool if the measured depth does not match the initial depth.

3. The method of claim 1, further comprising the phase metrology tool including an exposure wavelength between approximately 100 nanometers and approximately 400 nanometers.

4. The method of claim 3, further comprising the feature including a depth operable to produce a phase shift of approximately 180 degrees at the exposure wavelength.

5. The method of claim 1, further comprising providing a plurality of calibration sites formed on the substrate, a first calibration site located in a center of the substrate and a second calibration site located proximate an edge of the substrate.

6. The standard of claim 1, further comprising forming the feature in the substrate using a wet etch process.

* * * * *